(12) United States Patent
D'Andreta

(10) Patent No.: US 10,943,985 B2
(45) Date of Patent: Mar. 9, 2021

(54) COVER MEMBER FOR A ROBOT USED IN A PAINTING PROCESS HAVING ABSORPTIVE PROPERTIES

(71) Applicant: TD Industrial Coverings, Inc., Sterling Heights, MI (US)

(72) Inventor: Mark D'Andreta, Ortonville, MI (US)

(73) Assignee: TD INDUSTRIAL COVERINGS, INC., Sterling Heights, MI (US)

( * ) Notice: Subject to any disclaimer, the term of this patent is extended or adjusted under 35 U.S.C. 154(b) by 485 days.

(21) Appl. No.: 15/806,802

(22) Filed: Nov. 8, 2017

(65) Prior Publication Data

US 2018/0076298 A1   Mar. 15, 2018

Related U.S. Application Data

(62) Division of application No. 14/741,546, filed on Jun. 17, 2015, now abandoned.

(51) Int. Cl.
| | |
|---|---|
| *H01L 29/49* | (2006.01) |
| *B25J 19/00* | (2006.01) |
| *B32B 3/12* | (2006.01) |
| *B32B 3/26* | (2006.01) |
| *B32B 5/26* | (2006.01) |
| *B08B 17/04* | (2006.01) |
| *B05B 15/50* | (2018.01) |
| *H01L 21/28* | (2006.01) |
| *H01L 23/522* | (2006.01) |
| *H01L 27/06* | (2006.01) |
| *H01L 49/02* | (2006.01) |

(52) U.S. Cl.
CPC .......... *H01L 29/4983* (2013.01); *B05B 15/50* (2018.02); *B08B 17/04* (2013.01); *B25J 19/0075* (2013.01); *B32B 3/12* (2013.01); *B32B 3/266* (2013.01); *B32B 5/26* (2013.01); *H01L 21/28088* (2013.01); *H01L 21/28105* (2013.01); *H01L 21/28132* (2013.01); *H01L 23/5223* (2013.01); *H01L 27/0629* (2013.01); *H01L 28/86* (2013.01); *H01L 29/4966* (2013.01); *B32B 2305/026* (2013.01); *B32B 2305/186* (2013.01); *B32B 2571/00* (2013.01); *H01L 2924/00* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,758,068 B2 | 7/2004 | Shirasaki et al. | |
| 2002/0104335 A1* | 8/2002 | Shirasaki | D04B 21/16 66/196 |
| 2004/0258877 A1* | 12/2004 | D'Andreta | B25J 19/0075 428/99 |

* cited by examiner

*Primary Examiner* — Michael P. Rodriguez
(74) *Attorney, Agent, or Firm* — Stephen T. Olson; Harness, Dickey & Pierce, P.L.C.

(57) ABSTRACT

A cover member for a robot used in a painting process includes an inner knitted substructure, an outer knitted substructure and a spacer yarn positioned between and secured to the inner and outer knitted substructures. The cover member has stretchability, compressibility and resiliency similar to conventional resilient foam materials while at the same time providing characteristics for absorbing paint to substantially reduce paint dripping.

9 Claims, 7 Drawing Sheets

COVER MEMBER FOR A ROBOT USED IN A PAINTING PROCESS HAVING ABSORPTIVE PROPERTIES

CROSS-REFERENCE TO RELATED APPLICATIONS

This application claims priority to U.S. patent application Ser. No. 14/471,546 filed 17 Jun. 2015 which claims the benefit of U.S. Provisional Patent Application No. 62/016,776 filed 25 Jun. 2014, which aaplications are herein expressly incorporated by reference.

TECHNICAL FIELD

The present teachings generally relate to covers for protecting robots during a painting process. More particularly, the present teachings relate to a cover member for a robot with absorptive properties.

INTRODUCTION

This section provides background information related to the present disclosure which is not necessarily prior art.

Painted goods such as automobiles and the like conventionally utilize a dedicated paint area or paint room for the application of paint. The paint rooms are highly regulated to promote a quality paint finish. For example, most conventional clothing is prohibited due to the loose fibers which otherwise end up in the paint. Additionally, various lotions and other personal products are prohibited due to their adverse effect on the painting process.

In many applications, paint is applied to articles such as automobiles with automated paint robots. The robots advantageously eliminate human error, reduce labor and provide improved and repeatable quality. The application of paint with automated paint robots is necessarily associated with a degree of overspray. Some overspray of paint is required to ensure complete painting of the subject article.

It has heretofore been appreciated in the pertinent art that automated paint robots can be equipped with covers, including, but not limited to cloth covers, to both protect the robot and reduce paint defects. In this regard, the covers substantially shield the robots from paint overspray, thereby protecting the moving parts. Additionally, the covers may reduce the accumulation of paint that may otherwise result in the dripping of paint on the subject article. The covers can be periodically discarded and replaced. It may be similarly desired to cover other robots or equipment used during a painting process. One known robot cover is shown and described in commonly owned U.S. Ser. No. 10/874,909, filed Jun. 23, 2004. U.S. Ser. No. 10/874,909 is hereby incorporated by reference as if fully set forth herein.

While conventional coverings for robots have proven to be generally satisfactory for their intended uses, a continuous need for improvement remains in the relevant art.

SUMMARY

This section provides a general summary of the disclosure, and is not a comprehensive disclosure of its full scope or all of its features.

According to one particular aspect, the present disclosure provides a cover member for a robot used in a painting process, the cover member includes an inner fabric layer, an outer fabric layer and a spacer yarn positioned between and secured to the inner and outer fabric layers. The outer fabric layer wherein the cover member has stretchability, compressibility and resiliency similar to conventional resilient foam materials while at the same time providing characteristic for absorbing paint to substantially reduce paint dripping.

According to another particular aspect, the present disclosure provides a method of covering a portion of a robot used in a painting process and absorbing paint overspray. The method includes providing a cover member including an inner knitted substructure, an outer knitted substructure and a spacer yarn positioned between and secured to the inner and outer knitted substructures. The method additionally includes securing the cover member to the portion of the robot with the inner knitted substructure positioned against the portion of the robot. The method further includes absorbing paint into an area between the inner knitted substructure and the outer knitted substructure.

According to yet another particular aspect, the present teachings provide a method of protecting a portion of a robot used in a painting process from paint overspray. The method incudes providing a cover member including an inner fabric layer and an outer fabric layer. The method additionally includes positioning the cover member relative to the robot for protecting the robot from paint overspray. The method further includes absorbing paint into an area between the inner fabric layer and the outer fabric layer.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

DESCRIPTION OF VARIOUS ASPECTS

Figure 1:
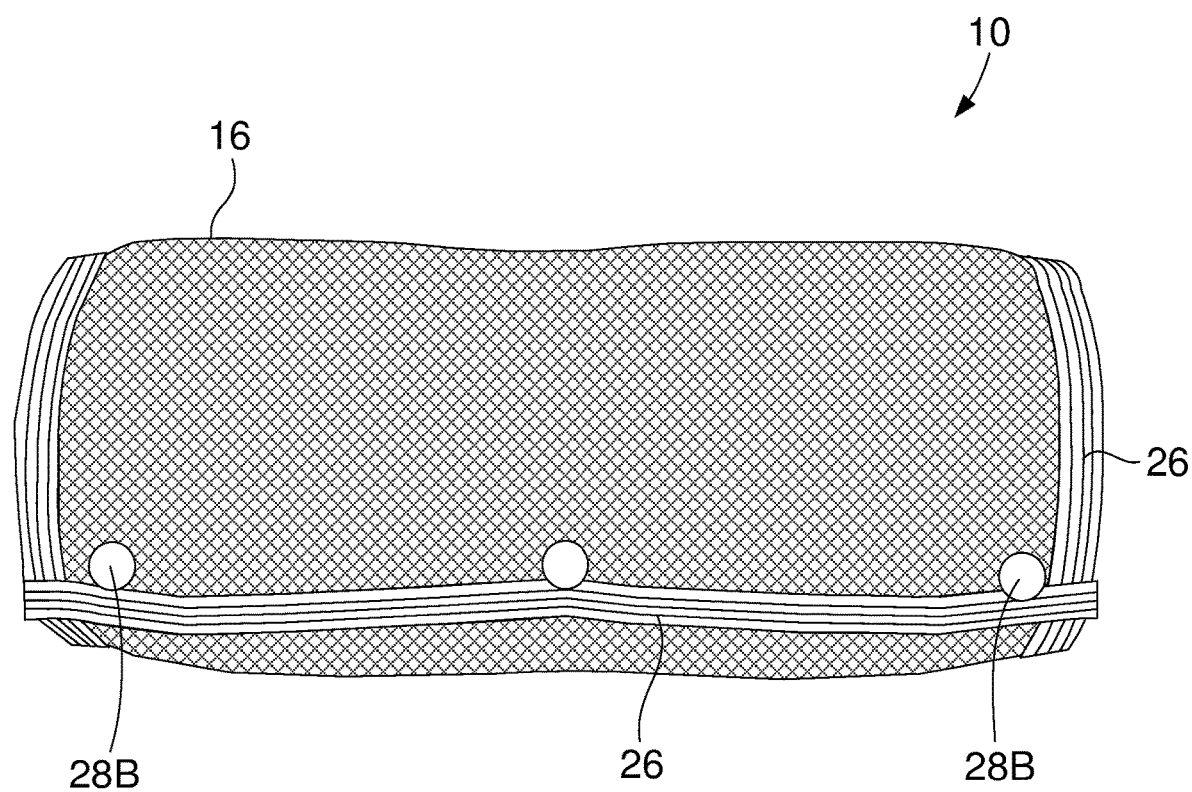
FIG. 1 is a side view of a cover member for a robot in accordance with the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

With general reference to FIGS. 1-7 of the drawings, a cover member for a paint robot constructed in accordance with the present teachings is illustrated and generally identified at reference character 10. The cover member 10 may be secured to an arm of the paint robot, for example. The present teachings may be adapted for use with various types of robots, including but not limited to paint robots for the automated delivery of paint to a vehicle or other article. The present teachings may also be used for other applications requiring the absorption of oversprayed paint.

Figure 2:
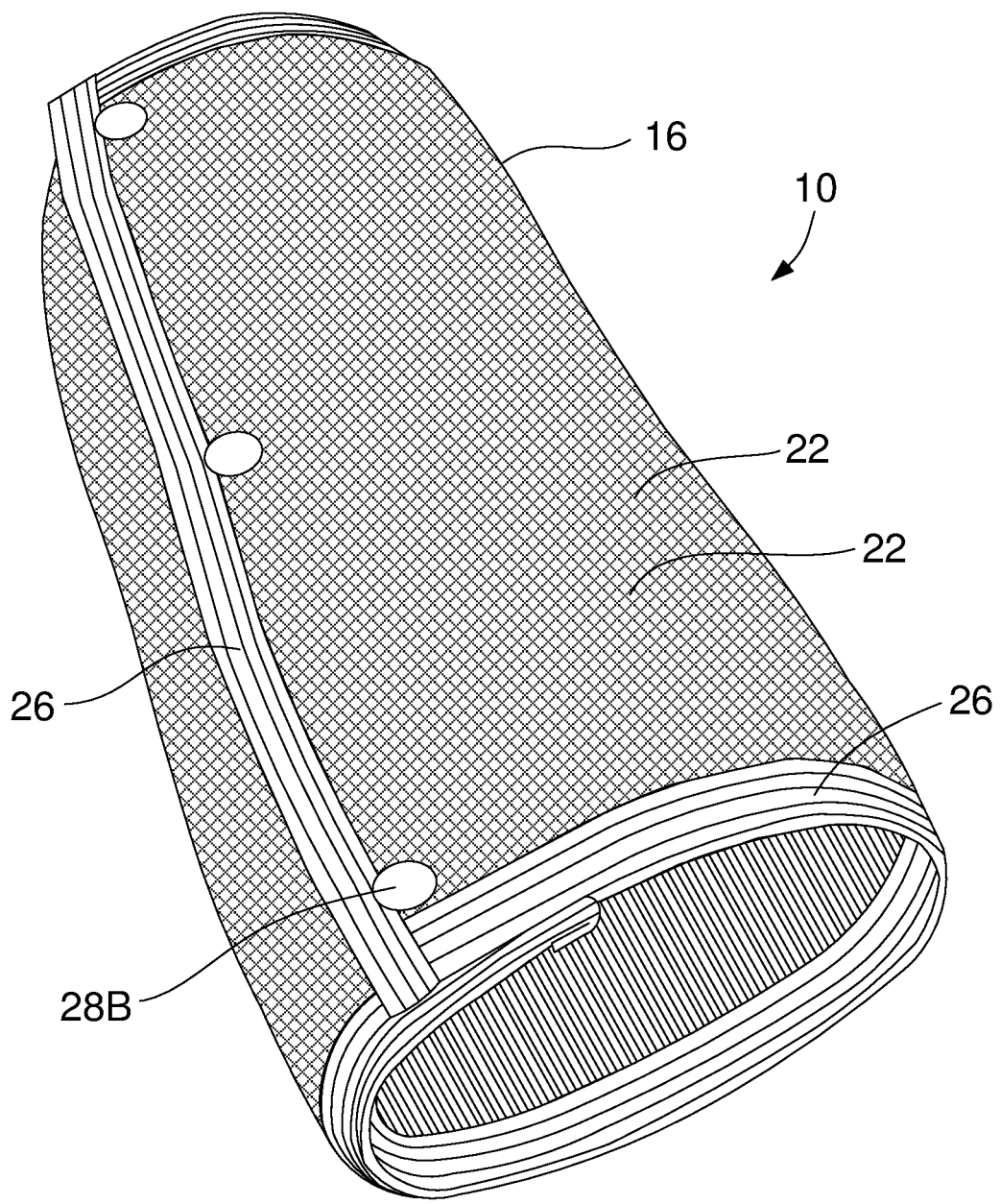
FIG. 2 is a perspective view of a cover member for a robot in accordance with the present disclosure.
Figure 3:
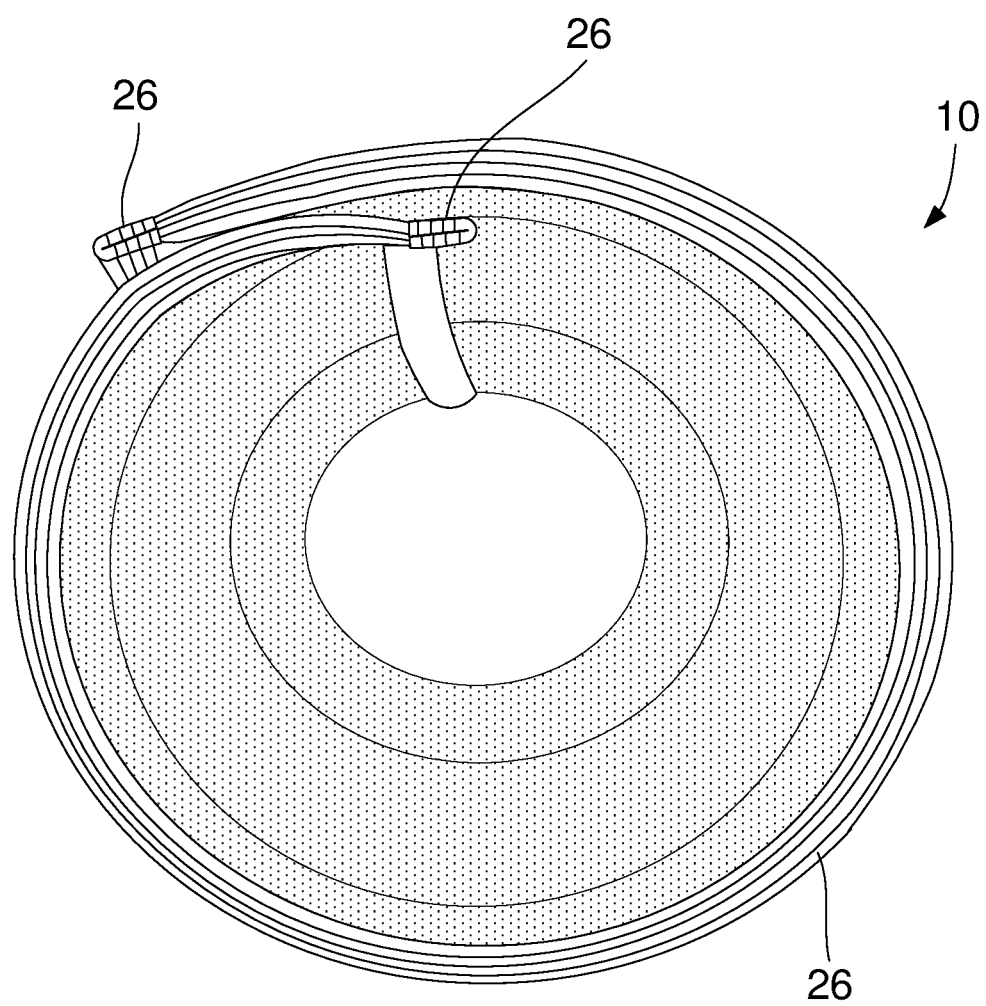
FIG. 3 is an end view of a cover member for a robot in accordance with the present disclosure.
Figure 4:
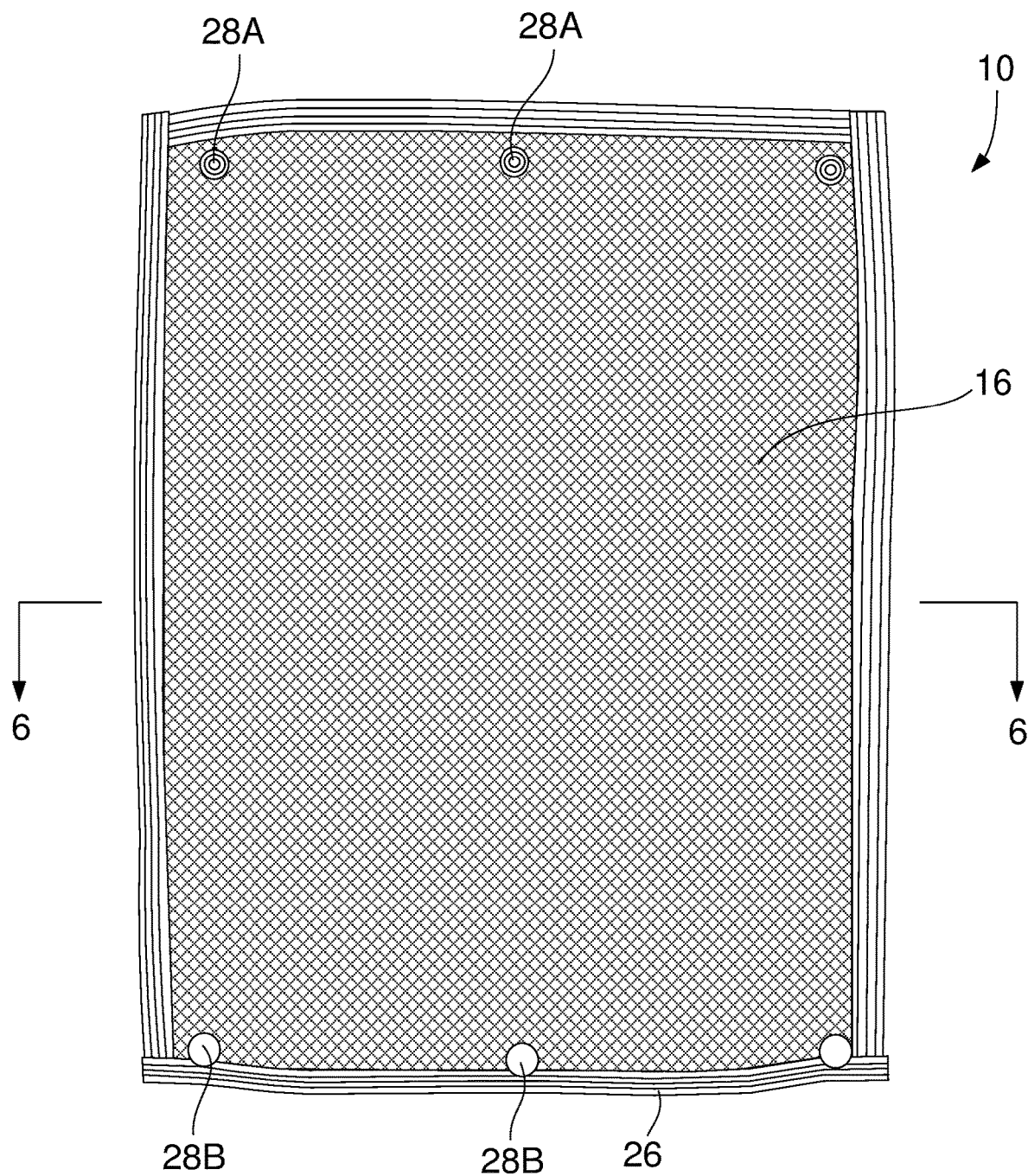
FIG. 4 is a plan view of an outer side of a cover member for a robot in accordance with the present disclosure, the cover member shown articulated to a flat condition.
Figure 5:
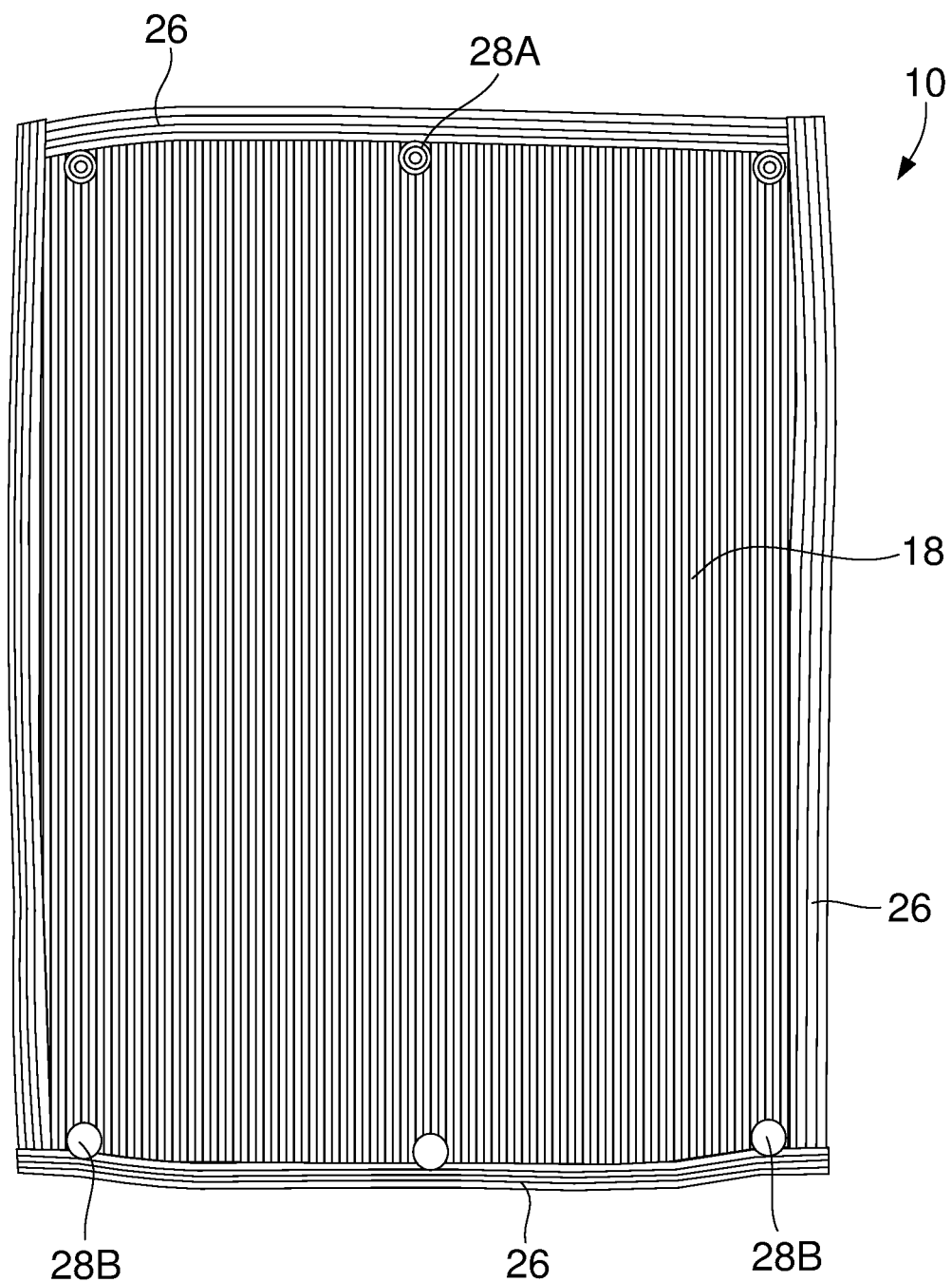
FIG. 5 is a plan view of an inner side of a cover member for a robot in accordance with the present disclosure, the cover member shown articulated to a flat condition.
Figure 7:
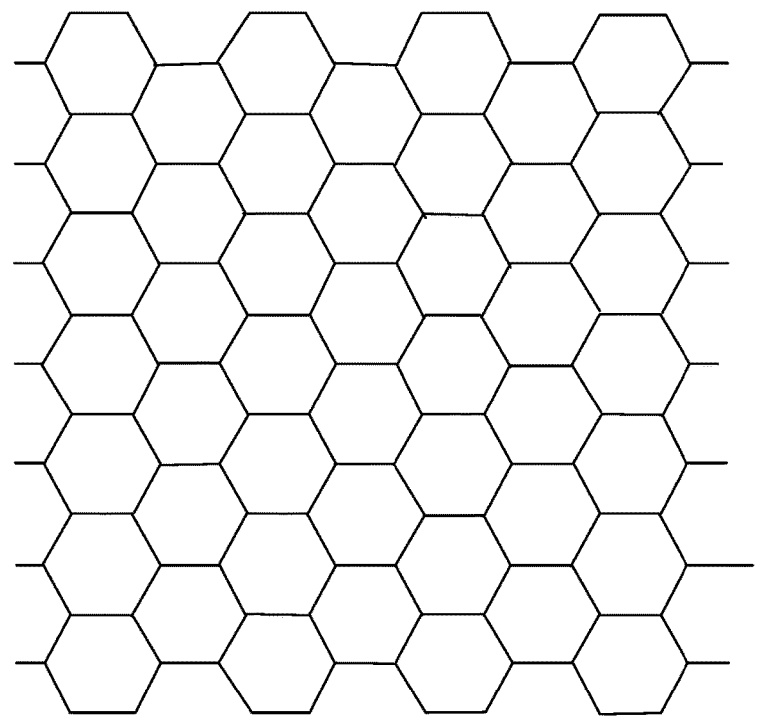
FIG. 7 is an enlarged view of a portion of the honeycomb pattern of an outer fabric layer of a cover member for a robot in accordance with the present disclosure.

FIGS. 1 through 3 illustrate the cover member 10 as it would be oriented when operatively secured to a robot. In this regard, the cover member 10 may be wrapped around and secured to an arm of a robot, for example. FIGS. 4 and 5 illustrate the cover member 10 in a flat condition prior to securement to a robot. In the embodiment illustrated, the cover member 10 is illustrated as a sleeve. FIG. 7 is a simplified view of the cover member 10 shown secured to an arm 12 of a robot 14. It will be understood, however, that the particular shape of the cover member 10 may vary within the scope of the present teachings. For example, the cover member 10 may be in the form of an apron securable to a primary cover for the robot.

As illustrated throughout the drawings, the cover member 10 of the present teachings may generally include an inner fabric layer or panel 16 and an outer fabric layer or panel 18. The inner fabric layer 16 may be an inner knitted substructure. The outer fabric layer 18 may be an outer knitted substructure. The inner and outer knitted substructures 16 and 18 may be spaced apart by spacer yarns 20. Explaining further, the spacer yarns 20 create a cavity 22 between the inner and outer knitted substructures 16 and 18 that is filled by the spacer yarns 20 and interstices between the spacer yarns 20. In the particular embodiment illustrated, the inner and outer knitted substructures 16 and 18 may comprise 300 denier textured set polyester. The spacer yarns may comprise 0.15 mm monofilament polyester. It will be appreciated that the particular materials chosen for the inner and outer knitted substructures 16 and 18 and the spacer yarns 20 are exemplary an may vary within the scope of the present teachings.

The outer knitted substructure 18 may be porous to allow paint to pass therethrough and enter the cavity 22. As particularly illustrated in the enlarged view of FIG. 7, the outer knitted substructure may be formed to include a plurality of holes or openings 24 providing direct access to the spacer yarns 20. As illustrated, the outer knitted substructure 18 may define a honeycomb pattern. The holes or openings 24 in the outer knitted substructure 18 allow paint to be absorbed into the cavity 22 and be captured/retained by the spacer yarns 20. The inner knitted substructure 16 may be non-porous to prevent paint in the cavity 22 from passing therethrough. The inner knitted substructure 16 may be more tightly knitted to prevent the passage of paint therethrough. In other embodiments, the inner fabric layer 16 may be constructed of a non-knitted fabric. The inner and outer knitted substructures 16 and 18 may both be flexible and stretchable.

The inner and outer knitted substructures 16 and 18 along with the spacer yarns 20 define a warp-knitted spacer fabric. The fabric may be knitted on a rib raschel machine having two needle bars in a manner well known in the art. One suitable technique for manufacturing a warp-knitted spacer fabric is shown and described in U.S. Pat. No. 5,385,036 which is incorporated by reference as if fully set forth herein. In alternative constructions, the inner and outer knitted substructures 16 and 18 may laminated to the spacer yarns.

Figure 6:
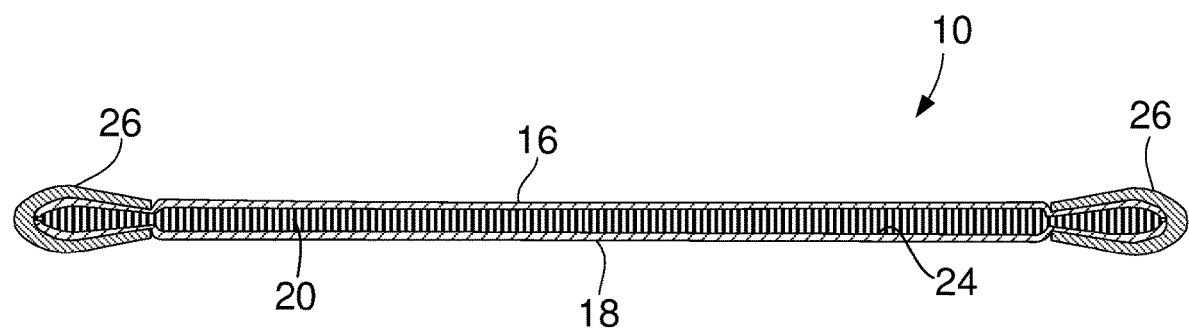
FIG. 6 is a cross-sectional view taken along the line 6-6 of FIG. 4.

When the cover member 10 is articulated to a flat condition (as shown in FIGS. 5 and 6), the inner and outer substructures 16 and 18 may be generally rectangular. In one embodiment, the inner and outer substructures 16 and 18 may have a length of approximately 18 inches and a width of approximately 13 inches. In this embodiment, the spacer yarns 20 may have an uncompressed thickness of about 0.5 inches. An edging material 26 may be sown about the perimeter of the cover member 10 in a manner well known in the art. It will be appreciated that the dimensions provided herein are merely exemplary and may be modified within the scope of the present teachings for adaptation to particular use environments.

The cover member 10 may include one or more fasteners 28 for securing the cover member to a robot. In the embodiment illustrated, the cover member 10 may include snap studs 28A and coopering caps 28B. Alternatively, the cover member 10 may be provided with hook and loop materials such as those commonly sold under the trademark Velcro®.

Figure 8:
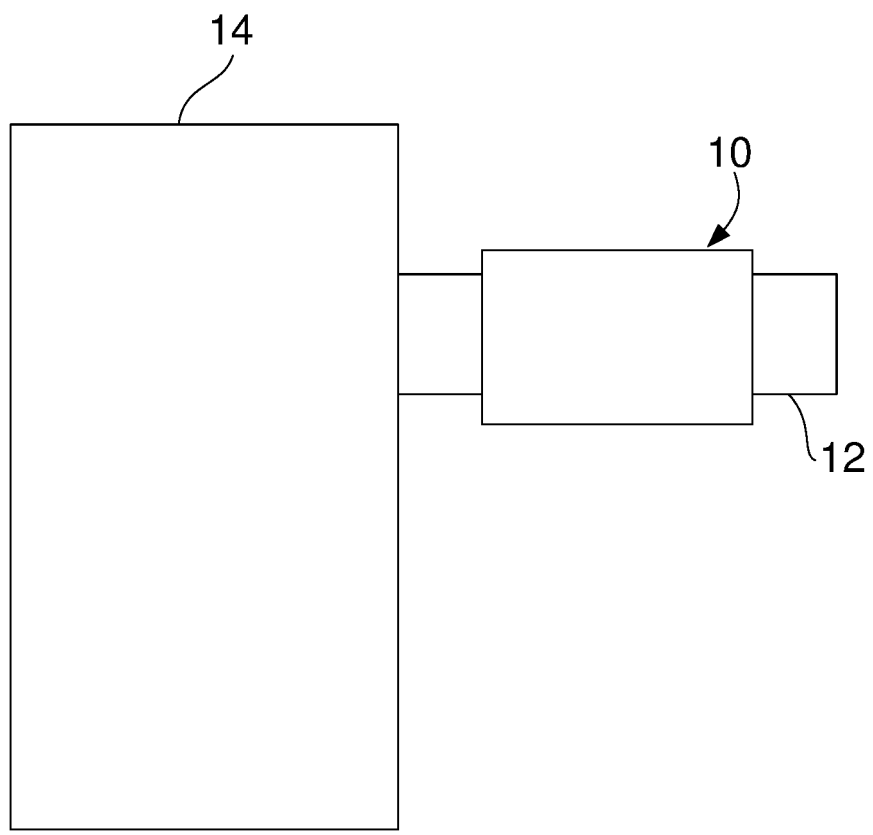
FIG. 8 is a simplified view of a cover member for a robot in accordance with the present disclosure, the cover member shown secured to an arm of the robot.

As particularly shown in the simplified view of FIG. 8, the cover member 10 may be wrapped around a portion of a robot 14, such as a horizontally extending arm 12. The one or more fasteners 28 may be used to secure the cover member 10 to the portion of the robot 14 with the inner substructure 16 positioned adjacent to the robot 14. The cover member 10 may protect the robot 14 from paint overspray. The paint overspray may be absorbed by the cover member 10 to prevent dripping of paint that may otherwise negatively impact the quality of the paint job. Explaining further, oversprayed paint maybe drawn into a space (e.g., the cavity 24) between the inner and outer knit substructures 16 and 18. The spacer yarns 20 may normally maintain spacing between the inner and outer knit substructures 16 and 18 and may also assist in retaining the paint within the cavity 24. The cover member 10 may periodically be removed, discarded and replaced.

Accordingly, it will be appreciated that the present teachings provide a cover member 10 for a robot 14 having stretchability, compressibility and resiliency similar to conventional resilient foam materials while at the same time providing characteristic for absorbing paint to substantially reduce paint dripping.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description has been provided for purposes of illustration and description. It is not intended to be exhaustive or to limit the invention. Individual elements or features of any particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method of covering a portion of a robot used in a painting process and for absorbing paint overspray, the method comprising:
   providing a cover member including an inner knitted substructure, an outer knitted substructure and a spacer yarn positioned between and secured to the inner and outer knitted substructures, the outer knitted substructure including a plurality of holes for allowing paint to be absorbed into an area between the inner knitted substructure and the outer knitted substructure;
   wrapping the cover member about the portion of the robot;
   securing the cover member to the portion of the robot with the inner knitted substructure position against the portion of the robot;
   absorbing paint through the plurality of holes and into the area between the inner knitted substructure and the outer knitted substructure; and
   retaining the paint absorbed into the area between the inner and outer fabric layers.

2. The method of claim 1, wherein the inner knitted substructure is non-porous and the outer knitted substructure is porous.

3. A method of protecting a portion of a robot used in a painting process from paint overspray, the method comprising:
   providing a cover member including an inner fabric layer and an outer fabric layer;
   positioning the cover member relative to the robot for protecting the robot from paint overspray by wrapping the cover member about the portion of the robot;
   absorbing paint into an area between the inner fabric layer and the outer fabric layer; and
   retaining the paint absorbed into the area between the inner and outer fabric layers.

4. The method of claim 3, wherein the cover member is a sleeve and positioning the cover member relative to the robot includes securing the sleeve around a portion of the robot.

5. The method of claim 3, wherein the cover member includes a spacer yarn positioned in the area between the inner and outer fabric layers.

6. The method of claim 5, further comprising retaining the absorbed paint within the area between the inner and outer fabric layers with the spacer yarn.

7. The method of claim 3, wherein the outer fabric layer includes a plurality of holes through which paint may pass into the area between the inner and outer fabric layers.

8. The method of claim 3, further comprising preventing absorbed paint from passing through the inner layer of fabric.

9. The method of claim 1, wherein the inner knitted substructure is non-porous and the outer knitted substructure is porous.

* * * * *